United States Patent
Akaogi et al.

(10) Patent No.: US 6,240,040 B1
(45) Date of Patent: May 29, 2001

(54) MULTIPLE BANK SIMULTANEOUS OPERATION FOR A FLASH MEMORY

(75) Inventors: Takao Akaogi, Cupertino; Lee Edward Cleveland, Santa Clara; Kendra Nguyen, San Jose, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/526,239

(22) Filed: Mar. 15, 2000

(51) Int. Cl.$^7$ ....................................................... G11C 8/00
(52) U.S. Cl. ................. 365/230.06; 365/185.11; 365/185.33; 365/230.08
(58) Field of Search ............. 365/230.06, 230.03, 365/230.05, 230.08, 239, 185.33, 185.11

(56) References Cited

U.S. PATENT DOCUMENTS

| | | | |
|---|---|---|---|
| 5,847,998 | 12/1998 | Van Buskirk | 365/185.33 |
| 5,867,430 | 2/1999 | Chen et al. | 365/189.04 |
| 6,016,270 | * 1/2000 | Thummalapally et al. | 365/185.11 |
| 6,088,264 | * 7/2000 | Hazen et al. | 365/185.11 |
| 6,097,666 | * 8/2000 | Sakui et al. | 365/230.06 |
| 6,111,787 | * 9/2000 | Akaogi et al. | 365/185.11 |

* cited by examiner

Primary Examiner—Richard Elms
Assistant Examiner—Hien Nguyen
(74) Attorney, Agent, or Firm—Brinks Hofer Gilson & Lione

(57) ABSTRACT

An address buffering and decoding architecture for a multiple bank (or N bank) simultaneous operation flash memory is described. For the duration of a read operation at one bank of the N banks, a write operation can only be performed on any one of the other N-1 banks. For the duration of a write operation at one bank of the N banks, a read operation can only be performed on any one of the other N-1 banks. The address buffering and decoding architecture includes a control logic circuit, an address selection circuit located at each of the N banks, and address buffer circuitry. The control logic circuit is used to generate N read select signals to select one bank of the N banks for a read operation and N write select signals to select another bank of the N banks for a write operation. Each address selection circuit is configured to receive from the control logic circuit a respective one of the N read select signals and a respective one of the N write select signals. The address buffer circuitry is used to simultaneously provide a write address and a read address in order to access core memory cells. Respective first portions of the write and read addresses are provided to the control logic circuit to generate the respective N read select signals and N write select signals. Respective second portions of the write and read addresses are provided to the respective address selection circuit.

10 Claims, 5 Drawing Sheets

MULTIPLE BANK SIMULTANEOUS OPERATION FOR A FLASH MEMORY

BACKGROUND

The present invention relates generally to semiconductor memory devices. More particularly, the present invention relates to multiple bank simultaneous operation for a flash memory.

Flash memory (or flash RAM) is a form of non-volatile storage that uses a memory cell design with a floating gate. High voltages are applied to the memory cell inputs to program (store charge on) the floating gate or to erase (remove charge from) the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

This complex nature of programming and erasing flash memory devices leads to a major challenge in that such devices do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from finctioning for unacceptably long time intervals if the flash memory is the only memory in the electronic system. Some prior flash memories allow erase suspend operations in order to address this difficulty. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

With conventional flash memories of the recent past, core cell data can not be read while other data are being programmed. From the system point of view, in order to program data into core cells of the flash memory, the microprocessor needs to issue a program command to the flash memory. Since the flash memory only is capable of reading out the data or programming the data individually or non-simultaneously, the program command has to be stored outside/external to the flash memory.

In addition, programming and erasing a flash memory involves higher than normal voltages as compared to performing read operations. The use of these higher than normal voltages present challenges when trying to implement the capability to simultaneously read while programming/erasing. Such challenges include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

In recent years, in order to address these issues, dual bank flash memories have been introduced. U.S. Pat. No. 5,867,430 to Chen et al., and U.S. Pat. No. 5,847,998 to Van Buskirk, et al., incorporated by reference herein, disclose dual bank architectures that enable simultaneous read and write operation. The dual bank flash memory can program the data while reading out other data (i.e. is capable of simultaneous operation), so the flash memory system can be greatly simplified.

Most recently, despite these advantages, dual bank flash memory systems have become more complex. Increasingly, design challenges have been encountered with respect to the addressing and data perspectives of flash memory implementation using multiple banks. It would be desirable to implement a more flexibly and efficiently designed flash memory, capable of multiple bank simultaneous operation. It would be advantageous to develop architecture and circuitry individualized and local to each bank so as to facilitate, for example, extension of the simultaneous operation architecture from dual bank or two banks to N banks.

Accordingly, there is a need for an extendable and flexible multiple bank architecture that is capable of simultaneous operation, that is, that allows simultaneous read and write (program or erase) operations.

SUMMARY

By way of introduction only, an exemplary embodiment of a multiple bank simultaneous read and write operation flash memory is presented.

An embodiment of an address buffering and decoding architecture to facilitate simultaneous reading from and writing to N banks of core memory cells in a memory is presented. For the duration of a read operation at one bank of the N banks, a write operation can only be performed on any one of the other N-1 banks. For the duration of a write operation at one bank of the N banks, a read operation can only be performed on any one of the other N-1 banks. The address buffering and decoding architecture includes a control logic circuit, an address selection circuit located at each of the N banks, and address buffer circuitry. The control logic circuit is used to generate N read select signals to select one bank of the N banks for a read operation and N write select signals to select another bank of the N banks for a write operation. Each address selection circuit is configured to receive from the control logic circuit a respective one of the N read select signals and a respective one of the N write select signals. The address buffer circuitry is used to simultaneously provide a write address and a read address in order to access core memory cells. Respective first portions of the write and read addresses are provided to the control logic circuit to generate the respective N read select signals and N write select signals. Respective second portions of the write and read addresses are provided to the respective address selection circuit.

Also presented is an embodiment of an N-tuple bank simultaneous operation flash memory. For the duration of a read operation at one bank of the N banks, a write operation can only be performed on any one of the other N-1 banks. For the duration of a write operation at the Nth bank, a read operation can only be performed on any one of the other N-1 banks. The memory includes a control logic circuit, address buffer circuitry, and N localized bank circuitries. The control logic circuit is used to generate N read select signals and N write select signals. The circuitries 1 through N-1 of the N localized bank circuitries include N-1 respective banks of core memory cells. The Nth circuitry includes an Nth bank of memory cells, address selection circuitry, a write operation control circuit, a write data bus, and a read data bus. The address selection circuitry is responsive to the Nth read select signal and the Nth write select signal. The write operation control circuit is responsive to the Nth write select signal. The write data bus is responsive to the Nth write select signal. The read data bus is responsive to the Nth read select signal.

An embodiment of a method, for use in a multiple bank flash memory, of performing simultaneous writing and reading of data is presented. A first portion of a write address and a first portion of a read address are provided to N address selection circuits corresponding to N banks of core memory cells. A second portion of the write address is provided to a control logic circuit. The second portion of the write address defines one bank for a write operation. A second portion of the read address is provided to a control logic circuit. The second portion of the read address defines one bank for a read operation. One of N write select signals from the control logic circuit is provided to each bank of the N banks for a write operation. One of N read select signals from the control logic circuit is provided to each bank of the N banks for a read operation. The first portions of the write and read addresses are gated to the N banks with the respective N write select signals and the respective N read select signals. The data that are accessed at write and read address sites in the N banks by the first portions of the write and read addresses are gated to data output and verification circuitry with the respective N write select signals and the N read select signals.

The foregoing discussion of a series of the presently preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

In recent years, simultaneous read and write dual bank flash memories have been introduced. Some examples of these memories are described in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference. These patents describe the implementation and operation of dual bank flash memory architectures that enable simultaneous read and write operation. A dual bank flash memory can program the data while reading out other data (i.e. is capable of simultaneous operation), so the flash memory system can be greatly simplified.

Most recently, despite these advantages, dual bank flash memory systems have become increasingly more complex. Design challenges have been increasingly encountered with respect to the addressing and data perspectives of flash memory implementation using multiple banks.

Presented herein is a more flexibly and efficiently designed flash memory, capable of multiple bank simultaneous operation. The embodiments described herein provide addressing, address selection, operation control signals and logic, and access circuitry local to each bank. An individualized architecture that is local to each bank of core cells of memory facilitates and makes practical the extension of the simultaneous operation architecture from dual bank or two banks to N banks.

The embodiments presented herein provide an extendable and flexible multiple bank architecture that is capable of simultaneous operation, that is, that allows simultaneous read and write operations. Generally, a write operation is understood to refer to a programming or erase operation.

Figure 1:
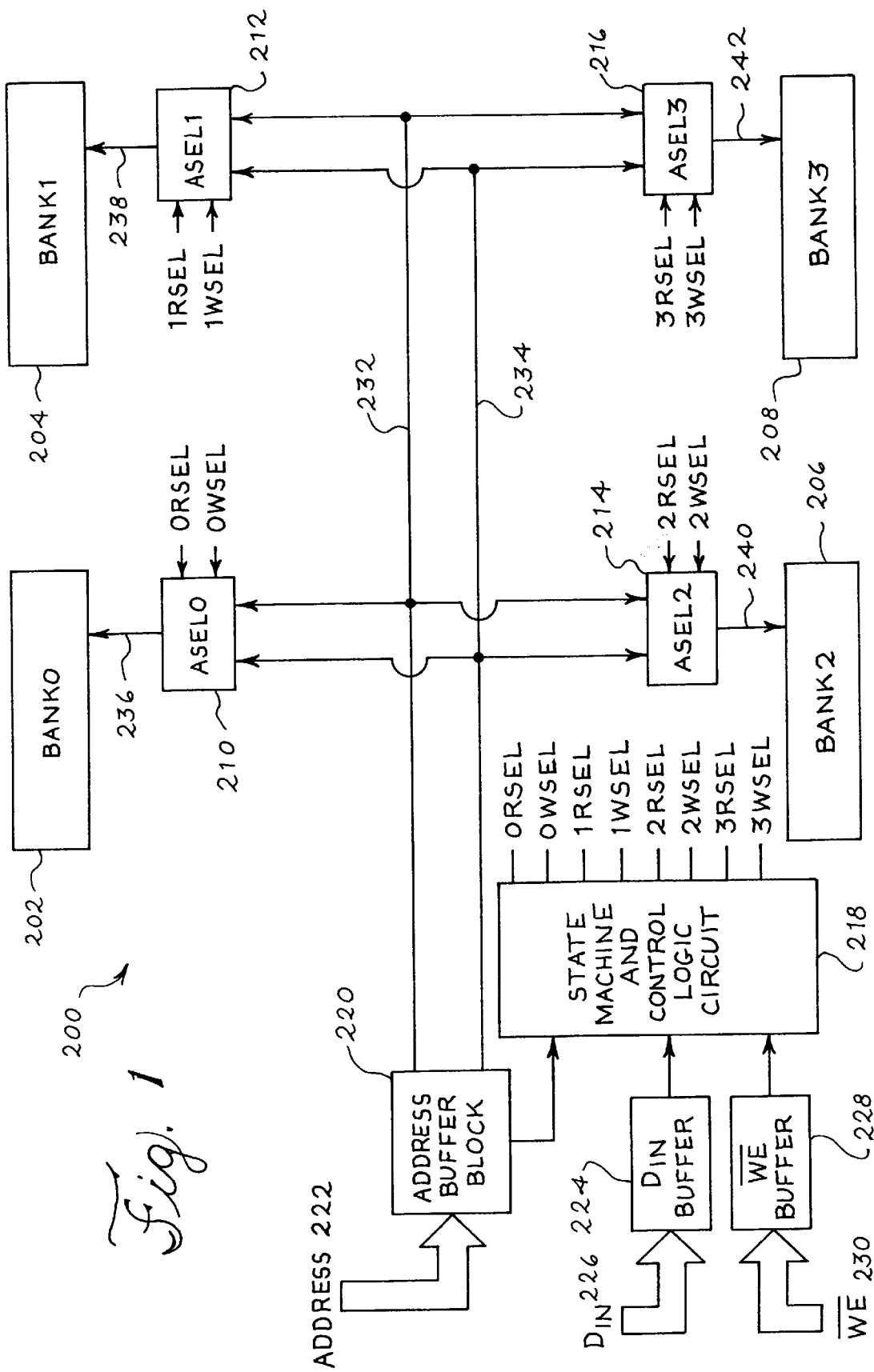
FIG. 1 is a block diagram of a simultaneous operation flash memory architecture presented from an addressing perspective.

FIG. 1 is a block diagram illustrating an addressing perspective of a multiple bank simultaneous operation flash memory 200 of a flash memory chip. The exemplary flash memory addressing architecture of multiple bank simultaneous operation flash memory 200 includes an address buffer block 220, a state machine and control logic circuit (logic circuit) 218, a write enable ($\overline{WE}$) buffer 228, a $D_{IN}$ buffer 224, and four banks of memory cells, bank0 202, bank1 204, bank2 206, bank3 208 with respective associated address selection circuit blocks, ASEL0 210, ASEL1 212, ASEL2 214, and ASEL3 216.

The address buffer block 220 provides a read address on read address bit lines or data busses 232 and a write (program or erase as applicable) address on write address bit lines or data busses 234 for selection by the address selection circuit blocks 210, 212, 214, 216. The address buffer block 220 is also in communication with the logic circuit 218. For clarity, one read address bit line 232 and one write address bit line 234 are shown in FIG. 1. Of course, multiple bit lines 232, 234 are preferably used in memory 200. The number of bit lines 232, 234 used to convey or carry the bits of the read and write addresses will in general depend on how many read and write address bits are utilized.

The flash memory 200 is described with reference to one read address and one write address at a time. It should be understood that in other embodiments, the address buffer block 220 is not limited to this arrangement and is capable of simultaneously providing multiple read addresses and/or multiple write addresses to the address selection circuit blocks 210, 212, 214, 216. These multiple addresses would in general imply additional bit lines 232, 234.

The address buffer block 220 receives a multiple-bit address input signal 222. Preferably, the address input signal 222 is externally applied to the address buffer block 220 from an external source outside of the flash memory 200. However, the address input signal 222 could be generated by an address generator (not shown) located on the flash memory chip or within the flash memory addressing architecture. Preferably, the address buffer block 220 includes address sequencing circuitry that is controlled by the logic circuit 218. Preferably, the address sequencing circuitry is used to generate sequential addresses during a write operation. In another embodiment, the address sequencer is part of the logic circuit 218.

The logic circuit 218 is capable of providing a plurality of signals to the flash memory 200. The signals provided by the logic circuit 218 preferably include program and erase related control signals (not shown) as well as operation selection signals.

The $D_{IN}$ buffer 224 receives a multiple-bit input signal $D_{IN}$ 226. Preferably, the multiple-bit input signal $D_{IN}$ 226 provides read and write operation commands intended for a command register located within the logic circuit 218. The input signal $D_{IN}$ 226 is stored in the $D_{IN}$ buffer 224 and is provided to the logic circuit 218 as needed. The input signal $D_{IN}$ 226 is the information to be programmed, during a program operation, into the core memory cells of the flash memory 200.

The write enable ($\overline{WE}$) buffer 228 receives a multiple-bit control input signal $\overline{WE}$ 226. The control input $\overline{WE}$ 226, also called write enable, is stored by the write enable buffer 228 and is provided to the logic circuit 218. The control input $\overline{WE}$ 226 is used to enable the write functions of the flash memory.

FIG. 1 illustrates a block diagram of the flash memory 200 from an addressing point of view. As an example, four banks, bank0 202, bank1 204, bank2 206, and bank3 208 are shown in FIG. 1. It should be understood that the flash memory addressing architecture for multiple bank simultaneous operation is not limited to four banks of memory cells. Rather, an advantage of the localized addressing and decoding architecture is that the flash memory 200 addressing architecture is expandable and can be extended to accommodate any number of banks of memory cells, that is, "N" banks of memory cells (here N=4). Any individual one of the N banks can be referred to as bank n. Therefore, although only FIG. 1 only illustrates four banks for clarity of description, the embodiments of the flash memory addressing architecture such as flash memory 200 addressing architecture for multiple bank simultaneous operation are not limited to four banks.

The four banks of memory cells, bank0 202, bank1 204, bank2 206, and bank3 208 are arrays (or sets) of flash memory cells. However, other non-volatile memories can also be used in other embodiments. Preferably, the banks 202, 204, 206, 208 are organized by words and then by sectors and can either be byte or word addressable.

The four banks of memory cells, bank0 202, bank1 204, bank2 206, bank3 208 all include localized address decode logic (not illustrated in FIG. 1). For example, the address decode logic for bank0 202 (bank1 204, bank2 206, bank3 208) includes an X decoder (not shown) and a Y decoder (not shown). Preferably, the X decoder includes a word line decoder and sector decoder. The word line decoder and the sector decoder receive address bits from the address selection circuit blocks ASEL0 210 (ASEL1 212, ASEL2 214, and ASEL3 216). Preferably, the Y decoder includes a bit line decoder and Y gating. The bit line decoder receives address bits from ASEL0 210 (ASEL1 212, ASEL2 214, ASEL3 216). X and Y decoders are well known in the art of semiconductor memories, and in particular, flash memories. Some examples of flash memory decoder implementations are described in U.S. Pat. No. 5,867,430 to Chen et al., and U.S. Pat. No. 5,847,998 to Van Buskirk, et al., incorporated by reference herein.

In FIG. 1, the logic circuit 218 provides a series of selection signals to the address selection circuit blocks 210, 212, 214, 216. The series of selection signals shown in FIG. 1 0RSEL, 0WSEL, 1RSEL, 1WSEL, 2RSEL, 2WSEL, 3RSEL, and 3WSEL. One function of the selection signals is to select the read address carried on bit lines 232 or the write address carried on bit lines 234 provided by the address buffer block 220, or individual bits of the read address or the write address.

After an appropriate read or write multiple bit-address is selected by the address selection circuit block 210 (212, 214, 216), the address is presented as signal 236 (238, 240, 242) in FIG. 1 to the bank of memory cells bank0 202 (bank1 204, bank2 206, bank3 208) via intervening row and line decoder circuitry (not shown).

It should be understood that the addresses of the flash memory 200 are generally multiple-bit digital word signals, since the selection of a particular core cell in memory requires a corresponding multiple-bit digital address. However, in the presently preferred embodiments, circuitry may be described with reference to particular bits of the multiple-bit digital address. It will evident in such instances to those skilled in the art to apply and extend the concepts illustrated by the circuitry to multiple-bit implementations. Those skilled in the art will appreciate that such implementations might include parallel implementations, including instances where circuitry for one bit is duplicated in parallel for each bit of a multiple bit address as required. Other implementations might include presenting all or some of the multiple address bits together to achieve the desired result or function.

The address input signal 222 of FIG. 1 is a multi-bit external input address that includes the address bits Ahi of FIG. 3 (described below). Preferably, the address is input to the flash memory 200 from off-chip or outside of the chip. The multi-bit address signal 222 may contain addressing information regarding read and write operations. Preferably, a user outside the chip provides addresses to be used for read and write operations. The address signal 222 may be 20 bits, for example, with two or more bits, depending on the number N of banks of memory cells (N=4 in FIG. 1), used to activate bank select logic in the logic circuit 218.

The address buffer block 220 includes a plurality of address buffers. Preferably, each individual address buffer is dual-ported, that is, each address buffer has two address outputs, one output for a read address, and the other for a write address. Preferably, the read address output is for a single bit of the read address, while the write address output is for a single bit of the write address. In other embodiments, the address buffer block 220 can also output multiple read addresses (the read addresses themselves being multiple-bit) as well as multiple write addresses (the write addresses themselves being multiple-bit).

Preferably, the read address bits and the write address bits from the address buffer block 220 are controlled by the address signal 222, either initially or directly. Preferably, the write address bits are latched inside the address buffer block 220 and incremented as a particular operation dictates.

Each bank n of memory cells (here bank0 202, bank1 204, bank2 206, and bank3 208) has an associated address selection circuit block ASELn (here n—0, 1, 2, 3). The respective associated address selection circuit block ASELn selects either the address bits for read or the address bits for write to supply each bank n with the necessary address signal dependent on the selection signals nRSEL and nWSEL generated by the logic circuit 218. If nRSEL is high, then the bank n is selected for read and the read address bits are is supplied to the bank n. If nWSEL is high, then the bank n is selected for write and the write address bits are supplied to the bank n. As stated above, the logic circuit 218 generates nRSEL and nWSEL.

Figure 2:
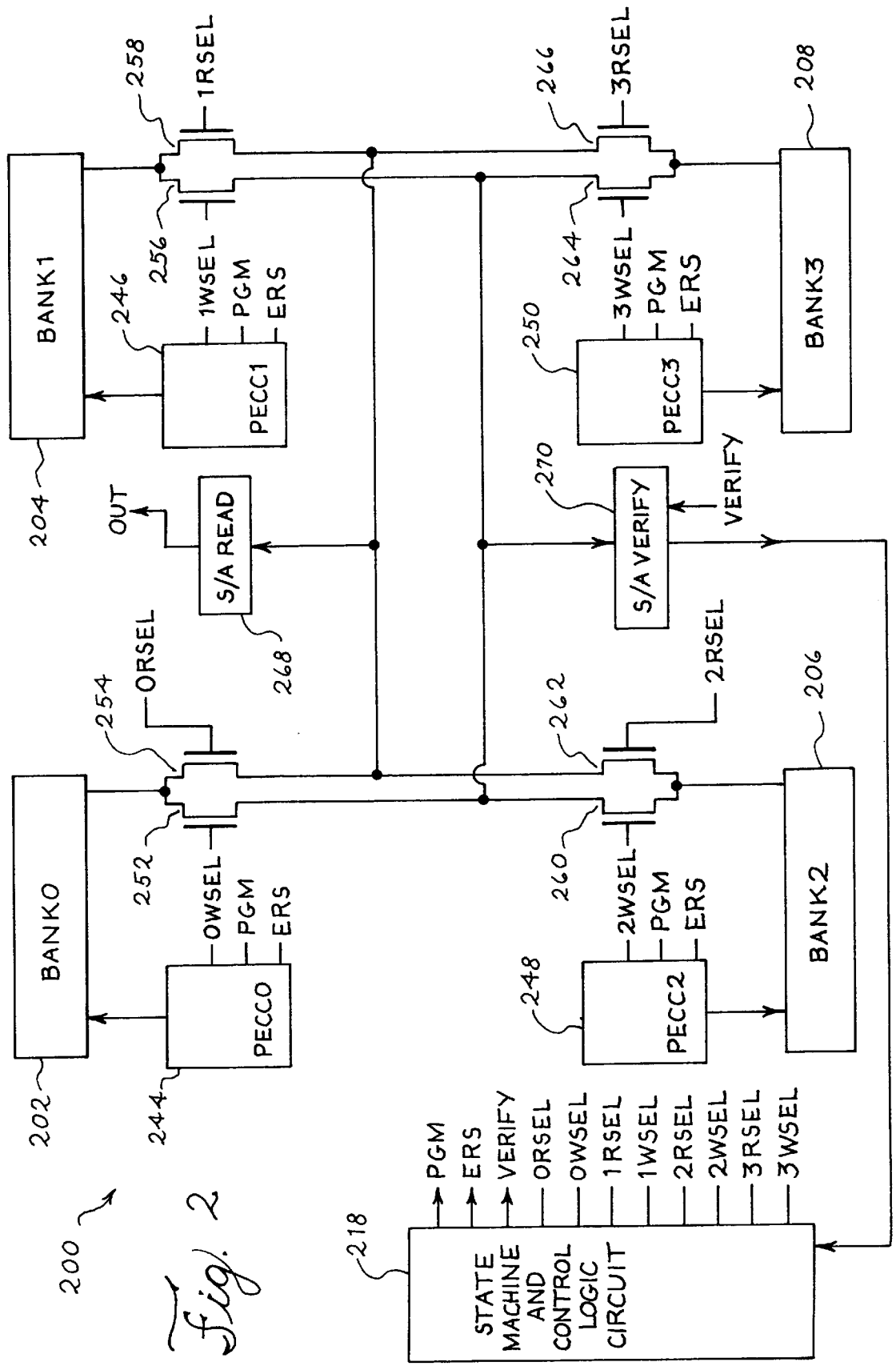
FIG. 2 is a block diagram of a simultaneous operation flash memory architecture presented from a data operations perspective.

FIG. 2 is a block diagram illustrating a data operations perspective of a multiple bank simultaneous operation flash memory 200 of a flash memory chip. The exemplary flash memory data operations architecture of multiple bank simultaneous operation flash memory 200 includes the four banks of memory cells, bank0 202, bank1 204, bank2 206, bank3 208, respective associated program/erase control circuits PECC0 244, PECC1 246, PECC2 248, PECC3 250, n-channel MOSFET transistors 252, 254, 256, 258, 262, 264, 266, the logic circuit 218, a read dedicated sense amplifier block 268 ("S/A READ"), and a verify dedicated sense amplifier block 270 ("S/A VERIFY"). The amplifier blocks 268 and 270 each contain one or more sense amplifiers to sense data from the banks 202, 204, 206, 208 of the flash memory 200.

The read sense amplifier block 268 is coupled to each bank of memory cells bank0 202, bank1 204, bank2 206, bank3 208, by way of respective n-channel MOSFET transistors 254, 258, 262, 266, respectively. Each bank of memory cells has its own dedicated read transistor. Of course, additional dedicated read transistors (not shown) may be included in the flash memory 200.

Each read transistor 254, 258, 262, 266 is switched on (i.e., conducts) and off at its gate input by application of the read selection signal applicable to the particular bank, 0RSEL, 1RSEL, 2RSEL, and 3RSEL, respectively. For example, the read sense amplifier block 268 will be able to read out the value of a core cell of the bank0 202 when the selection signal 0RSEL is high and the read transistor 254 is turned on and is conducting. The read sense amplifier block 268 reads the information from core cells of the flash memory 200 and outputs the data from the flash memory 200. Arrangements such as output buffering, data latching, or other data read out mechanisms may be utilized together or separately as appropriate to assist the read sense amplifier block 268 in outputting the core cell data. These mechanisms and/or arrangements are not illustrated in FIG. 2, but are preferably included in the flash memory 200. Of course, it should be understood that in other, embodiments, data output mechanisms and/or arrangements are located externally to the flash memory 200. According to the embodiments described herein, read sense amplification circuitry need not be provided separately for each bank.

The verify sense amplifier block 270 is coupled to each bank of memory cells bank0 202, bank1 204, bank2 206, bank3 208, by way of respective nchannel MOSFET transistors 252, 256, 260, 264. Each bank of memory cells has its own dedicated verify transistor for program or erase operations. Of course, additional dedicated verify transistors (not shown) may be included in the flash memory 200. Each verify transistor 252, 256, 260, 264 is switched on (i.e., in a heavy conducting state) and off at its gate input by application of the write select signal applicable to the particular bank, 0WSEL, 1WSEL, 2WSEL, and 3WSEL, respectively. For example, the verify sense amplifier block 270 will be able to verify the value of a core cell of the bank3 208 when the selection signal 3WSEL is high and the verify transistor 264 is turned on and is conducting. The verify sense amplifier block 270 senses the information from core cells of the flash memory 200 and presents the information to the state machine and control logic circuit 218 for verification and to decide the next state of the flash memory 200. According to the embodiments described herein, verify sense amplification circuitry need not be provided separately for each bank.

As in FIG. 1, the state machine and control logic circuit 218 (logic circuit 218) of FIG. 2 is capable of providing a plurality of signals to the flash memory chip, including global program and erase related control signals (including "PGM", "ERS," and "VERIFY" respectively, shown in FIG. 2) as well as the address selection signals 0RSEL, 1RSEL, 2RSEL, and 3RSEL for read and 0WSEL, 1WSEL, 2WSEL, and 3WSEL for write. The "VERIFY" signal is used to control the verify sense amplifier block 270.

Each of the four banks of the flash memory 200 data operations architecture has an associated respective program erase control circuit PECC0 244, PECC1 246, PECC2 248, and PECC3 250. Preferably, the program/erase control circuits local to each bank include the power supply for a program operation, the power supply for an erase operation, the power supply for a verify operation, the program data supply, as well as program and erase related circuits and other power supplies as appropriate. Of course, it should be understood that some or all of these power supplies and program and erase related circuits could be located external to the program/erase control circuits. The local program/erase control circuits PECC0 244, PECC1 246, PECC2 248, and PECC3 250 are controlled by the global signals PGM and ERS, supplied by the logic circuit 218.

Preferably, the program and erase related circuits include AND gate logic. As is known to those skilled in the art, the output of an AND gate is high or one if and only if all of its inputs are high or one. In a preferred embodiment, one or more AND gates control the program related circuit(s) such that the PGM signal is input to the one or more AND gates and drives the output(s) of any AND gates low when the PGM signal is low. In this way, the PGM signal from the logic circuit 218 controls the program circuit(s). Preferably, one or more AND gates control the erase related circuit(s) such that the ERS signal is input to the one or more AND gates and drives the output(s) of any AND gates low when the ERS signal is low. In this way, the ERS signal controls the erase circuit(s).

Further, the program and erase circuits preferably are enabled by AND gate logic having selection signal inputs along with the PGM or ERS input as applicable. That is, a program operation can only be performed on the bank n, and the program circuits for the bank n can only operate, if and only if the selection signal nWSEL AND the global control signal PGM are high. Similarly, an erase operation can only be performed on bank n, and the erase circuits for bank n can only operate, if and only if the selection signal nWSEL AND the global control signal ERS are high.

Considering the flash memory 200 as illustrated from an addressing perspective in FIG. 1 and from a data operations standpoint in FIG. 2, it should be understood that the circuitry surrounding and including each bank operates as a localized version of a conventional flash memory. That is, if the operation of each localized bank circuitry is viewed in isolation from the other localized bank circuitries, the operation is similar to a conventional flash memory. Of course, the address buffer block 220, the logic circuit 218, and the sense amplifier blocks 268, 270 direct and perform global aspects of the addressing, decoding, data sensing and verification, and operation control.

Using the respective read and write select signals to control respective transistors, data from the banks 202, 204, 206, 208 of FIG. 2 can be communicated via these transistors to either the read sense amplifier block 268 or the verify sense amplifier block 270. The sense amplifier blocks 268 and 270 are in communication with the logic circuit 218. While data from one bank are communicated to the read sense amplifier block 268, data from any other bank can be communicated to the verify sense amplifier block 270. Similarly, while data from one bank are communicated to the verify sense amplifier block 270, data from any other bank can be communicated to the read sense amplifier block 268. The output of the verify sense amplifier block 270 is sent to the logic circuit 218, which is used to verify that a particular byte has been programmed or erased.

Preferably, I/O buffers are used to pass data in and out of the flash memory 200. While a read is being performed on one of the banks, output data will be communicated from the read sense amplifier block 268 to the I/O buffers. Preferably, during an erase or program sequence, the logic circuit 218 will communicate status information to the I/O buffers so that an outside processor can poll the flash memory 200 for the erase or program status of the memory 200.

While one bank is being programmed, any of the other banks can be accessed for a read operation. For example, during a program of a byte at the bank0 202, the logic circuit 218 supplies the active write select signal 0WSEL to ASEL0 210 to select the write address from the address buffer block 220 for communication to the X and Y decoders (not shown) at the bank0 202. Further, the logic circuit 218 would store the data byte to be programmed from the I/O buffers for verification when the programming completes. The output of the bank0 202 would be sent to the verify sense amplifier block 270 via the transistor 252 for comparison with the stored input data. During a simultaneously initiated read operation at the bank3 208, the logic circuit 218, preferably after storing away the data to be programmed, supplies the active read select signal 3RSEL to ASEL3 216 to select the read address from the address buffer block 220 for communication to the X and Y address decoders (not shown) at the bank3 208. The output of the bank3 208 would be sent to the read sense amplifier block 268 via the transistor 266. Preferably, the output of the read sense amplifier block 268 would be sent to the I/O buffers and then a data bus (not shown).

Similarly, during an erase of a sector in bank2 206, the logic circuit 218 would supply the active write select signal 2WSEL to ASEL2 214 to select the write addresses from the address sequencing circuitry within the address buffer block 220. The address sequencing circuitry would be used to cycle through all the bytes in a particular sector to make sure that each byte is preprogrammed. The sector is subsequently bulk erased. After erasure, the address sequencing circuitry would be used to generate addresses to verify each byte of this erased sector. While the bank2 206 is being erased and ASEL2 214 (at the direction of the logic circuit 218) is selecting a write address from the address sequencing circuitry of the address buffer block 220, a read operation can be carried out in any other bank by using nRSEL to select the read address from the address buffer block 220 rather than a write address from the address sequencing circuitry. During the verify operation of the erase operation performed at one bank, the logic circuit 218 would verify the data using the verify sense amplifier block 270, while read data from any other bank would be communicated to the read sense amplifier block 268. Thus, every bank has write bit and read bit input address paths and verify and read bit output data paths that can be selected by the read and write select signals nRSEL and nWSEL so that any bank can be read from while any other one of the banks is simultaneously being written to.

Figure 3:
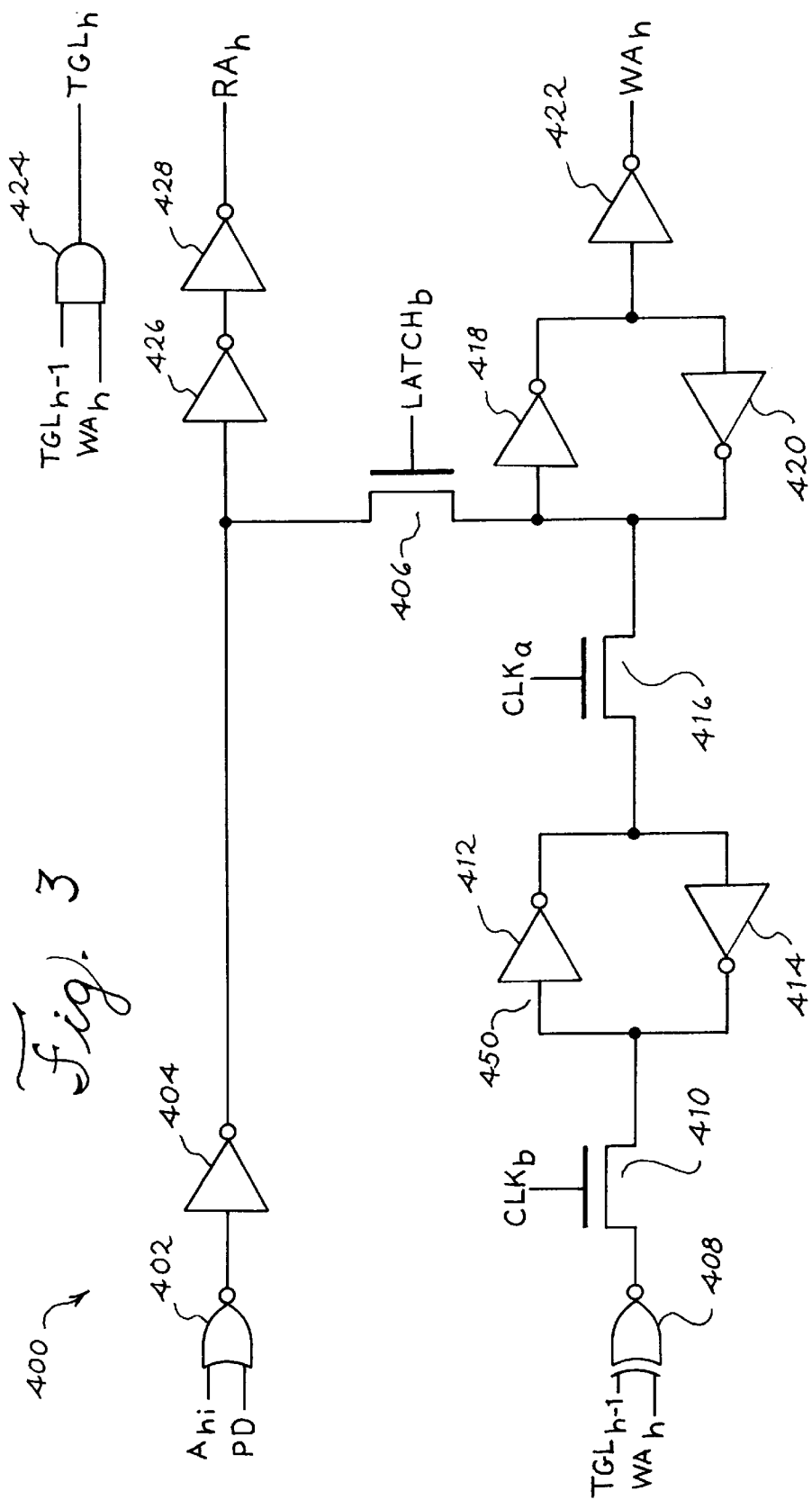
FIG. 3 is a circuit diagram of an exemplary embodiment of a dual-ported address buffer.

FIG. 3 is a simplified logic circuit diagram of a dual-ported address buffer 400 according to the multiple bank simultaneous operation flash memory 200. Preferably, the address buffer block 220 of FIG. 1 includes a series of address buffers 400 to output address bits RAh of the read dedicated address on bit lines 232 and address bits WAh of the write dedicated address on bit lines 234. The address buffer 400 includes a NOR gate 402, an exclusive-NOR or equivalence gate 408, a first latch 450, a second latch 460, inverters 404, 422, 426, 428, n-channel transistors 406, 410, 416 utilized as switches, and an AND gate 424. Preferably, the first latch 450 includes a pair of inverters 412, 414. Preferably, the second latch 460 includes a pair of inverters 418, 420.

A disadvantage of a conventional address buffer block with respect to a multiple bank simultaneous operation memory such as memory 200 is that address information corresponding to only one operation is output at a time. During a read operation, an address bit for read is output, while during a write operation, an address bit for write (program or erase) is output by the address buffer.

In the dual-ported address buffer 400, the read address output and the write address output can operate independently and simultaneously, depending on the control signals applied the buffer 400.

The address buffer 400 receives an address bit input Ahi. Preferably, the address bit inputs Ahi are a series of bits of the preferably externally applied address input signal 222 of FIG. 1. Preferably, the first and second latches 450, 460 are used to store address bits and form part of an address sequencer. The address sequencer is formed by a number of the address buffers 400 cascaded in series.

The NOR gate 402 receives the address bit input Ahi and an input signal "PD." The input signal PD is a power down signal used to power down the address buffer block 220. Preferably, the power down signal disables the clock buffer circuitry as well. As is known to those skilled in the art, the output of a NOR gate is one if and only if all of the inputs to the NOR gate are zero. Therefore, when the signal PD goes high, i.e. during power down, the output of the NOR gate 402 output is always low regardless of the value of Ahi. That is, RAh and WAh would be independent of Ahi and the address buffer 400 and thus the address buffer block 220 would be disabled. The output of the NOR gate 402 is coupled to the inverter 404. The inverter 404 is coupled to the source of the n-channel transistor 406, as well as to the input of the cascaded inverters 426, 428. The read address bit RAh is output from the inverter 428. The transistor 406 receives an input signal "LATCHb" at the gate input of transistor 406. The signal LATCHb is used to couple or decouple the second latch 460 and thus the write address bit output WAh to or from the input address Ahi. When the LATCHb signal is high, the transistor 406 is on, and the second latch 460 can be loaded with the external address Ahi, which preferably contains write or read information. In this way, the write address bit output WAh is controlled by the input address Ahi. When the LATCHb signal is low, the transistor 406 is off, and the read address bit output RAh is controlled by the input address Ahi. Although with the LATCHb signal low, the second latch 460 is decoupled from the input address Ahi, the write address would be stored in the address sequencer.

The exclusive-NOR gate 408 receives an input signal $TGL_{h-1}$ and an address bit input WAh. As is known to those skilled in the art, the output of an exclusive-NOR or equivalence gate is one if and only if all of the inputs to the exclusive-NOR gate are equivalent. The input signal $TGL_{h-1}$ is the output toggle signal from the previous address buffer in the cascade of address buffers. That is, the output toggle signal $TGL_h$ of this buffer 400 is generated from the output toggle signal of the previous buffer. Depending on the output toggle signal $TGL_{h-1}$ from the previous address buffer 400 and the output of the present address buffer 400, the address buffer output WAh toggles. If the output toggle signal $TGL_{h-1}$ from the previous buffer is low, then $TGL_h$ is low, and WAh does not toggle. The output of the equivalence gate 408 is coupled to the source of the n-channel transistor 410, which receives an input clock signal, $CLK_b$ at the gate input of the transistor 410. The drain of the n-channel transistor 410 is coupled to the first latch 450. The first latch 450 is coupled to the source of the n-channel transistor 416, which receives an input clock signal $CLK_a$ at the gate input of 416. The drain of the n-channel transistor 416 is coupled to the second latch 460 and the drain of the n-channel transistor 406. The second latch 460 is coupled to the inverter 422 to yield the address bit output WAh which will represent part of a write (program or erase) address, depending on the operation of the address buffer 400. The address bit output WAh is also fed back to the equivalence gate 408. The address bit output WAh and the signal $TGL_{h-1}$ are input to the AND gate 424 to yield the output signal $TGL_h$.

Preferably, the complement $\overline{RAh}$ of the read address bit output RAh is available for use by the memory 200. For example, the output of the inverter 426 can provide the complement $\overline{RAh}$ of the read address bit output RAh. Preferably, additional bit lines (not shown in FIG. 1) are utilized in memory 200 to convey the complementary read address bits $\overline{RAh}$ as necessary.

Preferably, the complement $\overline{WAh}$ of the write address bit output WAh is available for use by the memory 200. For example, the output of the second latch 460 can provide used for the complement $\overline{WAh}$ of the write address bit output WAh. Preferably, additional bit lines (not shown in FIG. 1) are utilized in memory 200 to convey the complementary write address bits $\overline{WAh}$ as necessary.

During a read operation, the address bit output RAh will be utilized as a read address bit. If a read operation is being performed, the signal LATCHb will generally go low and stay low for the duration of the read operation, unless a write address needs to be loaded into the second latch 460. When the signal PD input to the NOR gate 402 is held "low," then the output of the NOR gate 402 will be the complement of Ahi. It follows that the output of the inverter 404 will be Ahi, and that the address bit output RAh will be controlled by the address bit Ahi.

During a write operation, the address bit output WAh will be utilized as a program or an erase address bit, respectively. Once a write address is loaded or is internally generated, the signal LATCHb will be held low, so that the n-channel transistor 406 is turned off and the input to the second latch 460 is isolated and independent from the address Ahi. In the case where the write address must be loaded, the signal will go high. In a program operation, the address bit input/output WAh is latched in the address buffer 400 through the first and the second latches 450, 460 and the feedback of the signal WAh.

For example, assume that incoming external address signal 222 and thus Ahi is a write address. The bits of the write address would then be latched into or stored in the latches 450, 460 in the address buffer 400 by the signal LATCHb going high. Then the write address may be output as address bit output WAh during a write operation. During a read operation, address bit output RAh will be sent to the appropriate bank. Even with LATCHb going low, the write address is still available because the write address was latched in the address buffer 400.

An erase operation in a flash memory typically requires verification that the core cells at all of the address locations are erased properly. An address sequencer is incorporated in the address buffer 400 to coordinate the verification of the requisite address locations. The address sequencing is accomplished by the input clock signals $CLK_a$ and $CLK_b$. Preferably, the logic circuit 218 generates the clock signals $CLK_a$ and $CLK_b$. The input clock signal $CLK_a$ may be synchronized with an internally generated memory chip clock, while the input clock signal $CLK_b$ can be set to toggle each time that an embedded series of operations at the address location finishes. In this way, the internal address will be incremented properly when an internal address transition is needed, that is, when the internal address needs to transition to the next address. Although the input clock signals $CLK_a$ and $CLK_b$ can be generated via any suitable arrangement of circuitry, the $CLK_b$ signal as described will need to know when the operations at each address location finishes and might advantageously be implemented by the logic or control circuit 218. In a useful embodiment, the $CLK_b$ signal is the complement of the $CLK_a$ signal.

Figure 4:
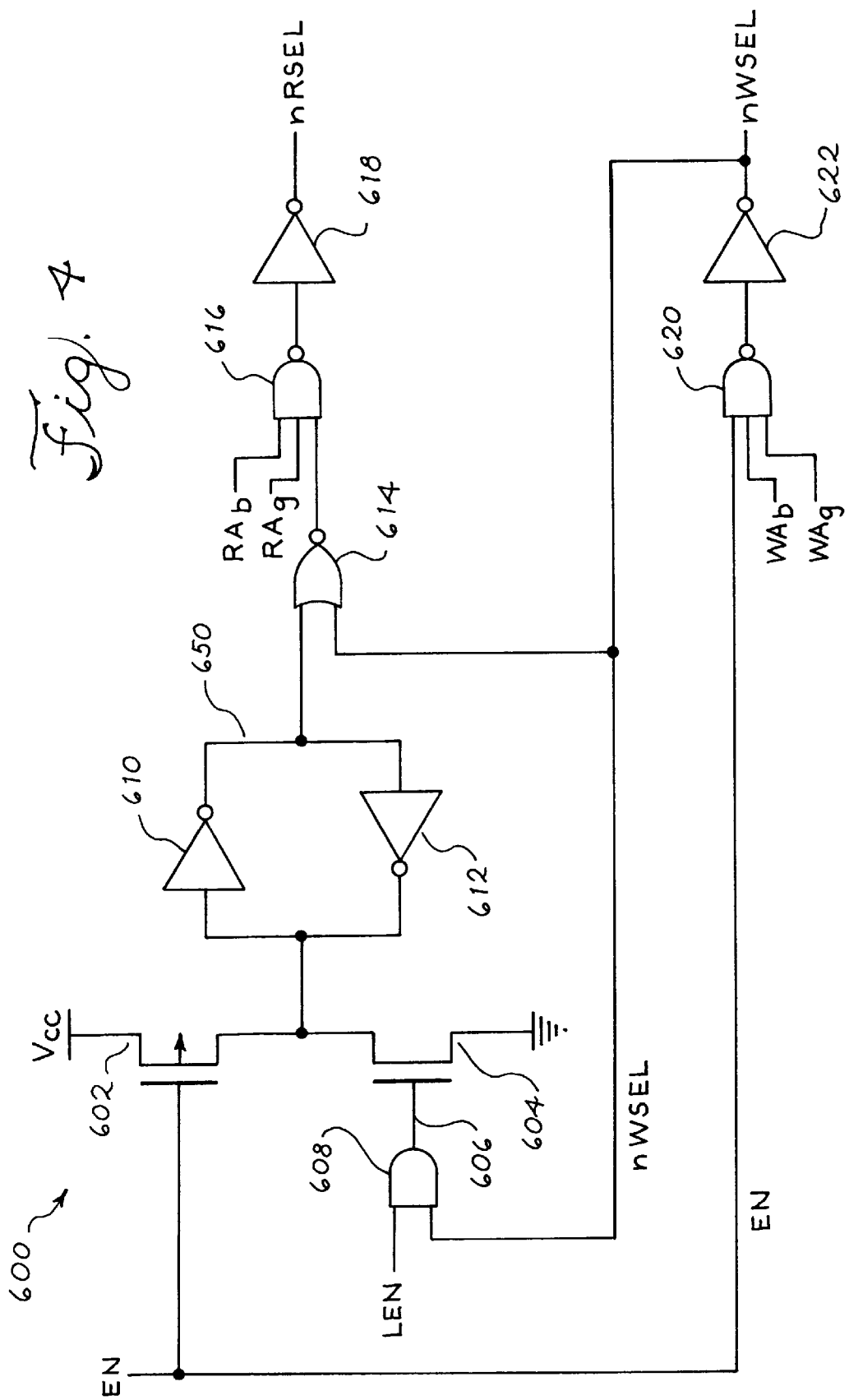
FIG. 4 is a circuit diagram of an exemplary embodiment of a portion of a control logic circuit used to generate read and write operation select signals individualized to each bank.

FIG. 4 is a read and write operation select signal generator circuit 600 according to the multiple bank simultaneous operation flash memory 200. Preferably, the state machine and control logic circuit 218 includes a series of select signal generator circuits 600, one for each of the four banks. In general, if there are N banks, there will be N select signal generator circuits. The read and write operation select signal generator circuit 600 includes a two-input AND gate 608, a latch 650, a p-channel MOSFET 602, an n-channel MOSFET 604, a two-input NOR gate 614, and a pair of three-input NAND gates 616, 620 with respective inverters 618, 622. Preferably, the latch 650 includes a pair of inverters 610, 612.

An enable ("EN") signal is applied to the gate of the p-channel MOSFET 602 and an input of the three-input NAND gate 620. The two other inputs of the three-input NAND gate 620 are address bit signals WAb and WAg used for bank decoding, as explained in more detail below. In this case of four banks, all four combinations of the inverted and noninverted values of the signals WAb and WAg are used, respectively, for bank address decoding. For simplicity, the noninverted values of the signals are shown entering the NAND gate 620 of FIG. 4. The NAND gate 620 is coupled to the input of the inverter 622, and effectively performs the function of an AND gate (not shown). The output of the inverter 622 is the generic write select signal nWSEL. This signal is fed back to the AND gate 608 and the NOR gate 614. A latch enable ("LEN") signal is also applied to the two-input AND gate 608. The AND gate 608 outputs an nth bank latch enable signal ("nLEN") at node 606. The N circuits 600 that generate N nRSEL and N nWSEL signals respectively, also generate N respective internal nLEN signals.

The source of the p-channel MOSFET 602 is connected to the supply voltage $V_{CC}$ while the drain of the transistor 602 is coupled to the drain of the n-channel MOSFET 604 and to the latch 650. The source of the transistor 604 is connected to ground while the gate of the MOSFET 604 receives the signal nLEN at node 606 from the AND gate 608. The output of the latch 650 is coupled to one input of the two-input NOR gate 614.

The output of the NOR gate 614 is coupled to an input of the three-input NAND gate 616. The two other inputs of the three-input NAND gate 620 are address bit signals RAb and RAg used for bank decoding, as explained in more detail below. In this case of four banks, all four respective combinations of the inverted and noninverted values of the signals RAb and RAg are used for bank address decoding. For simplicity, the noninverted values of the signals are shown entering the NAND gate 616 of FIG. 4. The NAND gate 616 is coupled to the input of the inverter 618, and effectively performs the function of an AND gate (not shown). The output of the inverter 618 is the generic read select signal nRSEL.

The circuit 600 generates the read select signal nRSEL and the write select signal nWSEL. The signals nRSEL and nWSEL correspond to the nth bank of core memory cells. In the multiple simultaneous operation flash memory 200 of FIG. 1, there are four banks (N=4), bank0 202, bank1 204, bank2 206, and bank3 208, with bank n referring generally to the nth bank. Therefore, there are four read select signals 0RSEL, 1RSEL, 2RSEL, 3RSEL and four write select signals 0WSEL, 1WSEL, 2WSEL, 3WSEL (i.e., n=0,1,2,3) as shown in FIG. 1. The circuit 600 is designed so that nRSEL will be high or active when a read operation is performed at the bank n. Similarly, nWSEL will be high or active when a write operation, that is, a program or erase operation is performed at the bank n.

Certain quantities of bits of the read and write addresses are used to determine which bank a cell address location is in. If there are four banks (N=4), only two bits ($2^2$=4) will be needed to uniquely describe the banks. If there are seven (N=7) or eight (N=8) banks, for example, three bits ($2^3$>7; $2^3$=8) will be needed. If there are N banks, then in general y bits (where $2N>2^y \geq N$) are needed to represent the banks. The N read select and N write select signals are uniquely determined by, using this nomenclature above, a y bit to N decoder (where $2^y \geq N>2^{y-1}$). For each combination of values of the y inputs, exactly one of the output lines will be high or active, so that the bank n at which the operation (read or write) is to occur is uniquely identified by the active output line.

The read and write addresses can thus each be characterized as having a first portion and a second portion. Generally, these portions consist of a series of address bits. Each of the portions for each type of address contains information.

The quantity of each portion in terms of bits will depend on the information carried by the portions. The first portion of a read or write address, for example, can be used to determine which bank a cell address location is in, i.e. bank decoding. The second portion of a read or write address, for example, can be used to determine the particular location of the cell within a bank. Further, information regarding the intended use of the address in a read or a write operation can also be coded into the address signal 222 of FIG. 1.

In the four bank memory 200, N is equal to 4 and is represented by two address bits. Thus, according to the embodiment illustrated in FIG. 1, the first portions of both the read and the write address would be two bits in size. One exemplary bit of a series of read address bits is RAh of FIG. 3. For example, if the read address is 20 bits in length, and two bits are used for bank decoding, two exemplary bits can be referred to as RAb and RAg. The bank decoding bits that make up of the first portion of the read address, RAb and RAg, are input to the NAND gate 616 in FIG. 4 in order to generate the nRSEL read select signal. In general, inverted and non-inverted values of bits RAb and RAg of the read address bits exemplified by RAh are provided to N NAND gates in order to generate the N read select signals. N (corresponding to the number of banks, here N=4) of the $2^y$ (here $2^2$=4) possible combinations of the inverted and non-inverted values of the signals are for bank decoding purposes. In the case of four banks, the inputs to the four NAND gates 616 in four circuits 600 will be RAbRAg, $\overline{RAb}$RAg, RAb$\overline{RAg}$, and $\overline{RAb}$$\overline{RAg}$.

Similarly, one exemplary bit of a series of write address bits is WAh of FIG. 3. Two exemplary bits from the write address used for the purpose of bank decoding in the memory 200 can be referred to as WAb and WAg. The bank decoding bits that make up of the first portion of the write address, WAb and WAg, are input to the NAND gate 620 in FIG. 4 in order to generate the nWSEL write select signal. In general, inverted and non-inverted values of bits WAb and WAg of the write address bits exemplified by WAb are provided to N NAND gates in order to generate the N write select signals. N (corresponding to the number of banks, here N=4) of the $2^y$ (here $2^2$=4) possible combinations of the inverted and non-inverted values of the signals are for bank decoding purposes. In the case of four banks, the inputs to the four NAND gates 620 in four circuits 600 will be WAbWAg, $\overline{WAb}$WAg, WAb$\overline{WAg}$, and $\overline{WAb}$$\overline{WAg}$.

The operation of the circuit of FIG. 4 is driven largely by three signals (in addition to the feedback of signal nWSEL). The enable ("EN") signal is a pulsed signal that is low during a read operation and is preferably pulsed once to initiate a write operation. The latch enable ("LEN") signal is a pulsed signal that is low during a read and during a program operation and is preferably pulsed once to initiate an erase operation. The nth bank latch enable signal ("nLEN") at node 606 is active when nWSEL is high or active AND the LEN signal is pulsed or goes high. That is, the nLEN signal is active when a write operation is enabled into the bank n AND that write operation is an erase operation.

During a read operation, the EN signal is low or not asserted. As a result, the output of NAND gate 620 will be high. It follows that the output of the inverter 622 will be low, so that the write select signal nWSEL is not active or is low. Therefore, as expected, the write select signal nWSEL is low at all times during a read operation. With nWSEL low, the signal nLEN at node 606 is low (regardless of the value of LEN, which is low during a read operation), and transistor 604 is off. Meanwhile, a low value of the EN signal at the gate of the transistor 602 turns the p-channel MOSFET 602 on, pulling the input to the latch 650 high. The two-input NOR gate 614 receives the output of the latch 650, which is low, and the write select signal nWSEL, which is low. Thus, the output of the NOR gate 614 is high. The output of the NAND gate 616 will be low and the output of the inverter 618 high. This occurs because the appropriate combination (i.e. one yielding high logical values) of bank decoding read address bits have been presented to the NAND gate 616 for the bank n along with the high output of the NOR gate 614. The net result is that the read select signal nRSEL will be active (that is, high) when a read operation is performed at the bank n.

During a program operation, the EN signal is preferably pulsed once to initiate a write operation. Thus, when the EN signal goes high, the output of the NAND 620 will be low and the output of the inverter 620 high. This occurs because the appropriate combination (i.e. one yielding high logical values) of bank decoding write address bits have been presented to the NAND gate 616 for the bank n along with the pulsed active EN signal. The write select signal nWSEL will be active or high, which drives the output of NOR gate 614 low, the output of the NAND gate 616 high, and the read select signal nRSEL low or inactive. Thus, nWSEL at a high level forces nRSEL to stay low so that conflict between the modes of operation at one bank can be avoided. The net result is that write select signal nWSEL will be active when a write operation, in this instance a program operation, is performed at the bank n.

During an erase operation, the EN signal is preferably pulsed once to initiate a write operation. Thus, when the EN signal goes high, the output of the NAND 620 will be low and the output of the inverter 620 high. This occurs because the appropriate combination (i.e. one yielding high logical values) of bank decoding write address bits have been presented to the NAND gate 616 for bank n along with the pulsed active EN signal. Preferably, after the EN signal goes high, the LEN signal will be pulsed. The nth bank latch enable signal ("nLEN") at node 606 is active when nWSEL is high or active AND the LEN signal is pulsed or goes high. That is, the nLEN signal is active at node 606 and the n-channel transistor 604 turns on from the rising nLEN signal at its gate input. The input to the latch 650 is brought toward ground, so that the output of the latch 650 goes high. The output of the NOR gate 614 goes low since the nWSEL signal is high and the output of the latch 650 goes high, resulting in a low value for nRSEL. Once the bank n is selected for an erase operation, the read select signal nRSEL will never go high. That is, the latch 650 will force nRSEL low until the EN signal goes low (i.e. during a read operation). The LEN signal will be pulsed multiple times to select multiple sectors (of the bank n of core memory cells) to be erased. The net result is that the write select signal nWSEL will be active when a write operation, in this instance an erase operation, is performed at the bank n.

Preferably, the LEN signal and the EN signal will be generated by state machine and control logic located on the flash memory chip. For example, the signals LEN and EN may be generated with the control logic circuit 218.

Figure 5:
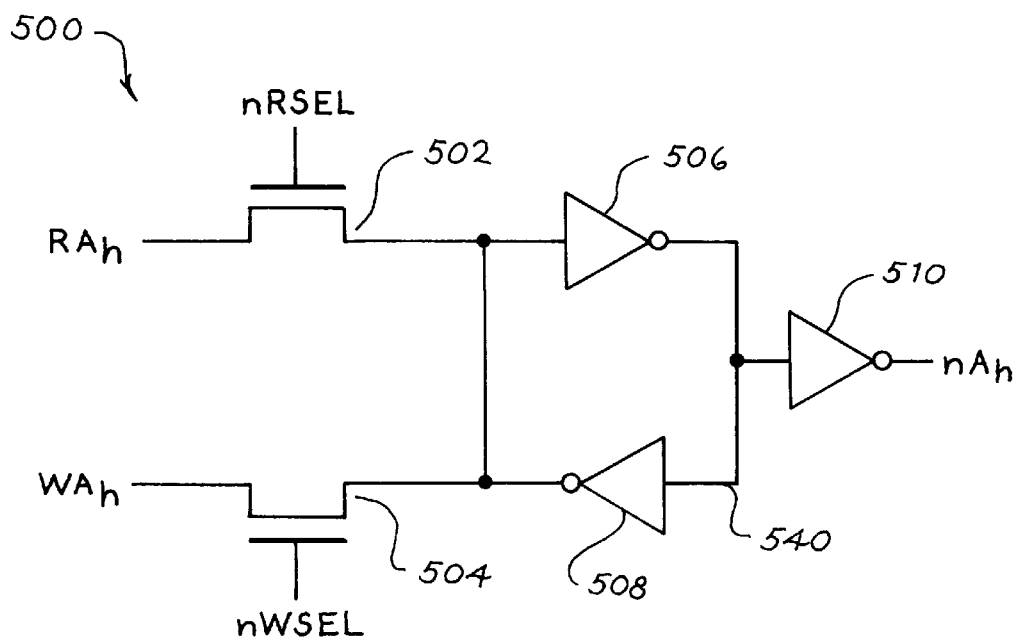
FIG. 5 is a circuit diagram of a first exemplary embodiment of an address selection circuit n that is locally implemented at a bank n of memory cells.

FIG. 5 is a first exemplary address selection circuit 500 according to the multiple bank simultaneous operation flash memory 200. Preferably, the address selection circuit blocks ASEL0 210, ASEL1 212, ASEL2 214, and ASEL3 216, respectively, each include a series of address selection circuits 500. The first exemplary address circuit 500 includes n-channel transistors 502, 504, a latch 540, and an inverter 510. Preferably, the latch 540 includes a pair of inverters 506, 508. Each circuit 500 is configured to receive a read address bit RAh and a write address bit WAh. In general, if the read address has q bits, there will be q values of RAh. Similarly, if the write address has q bits, there will be q values of WAh. Preferably, only the read or write address bits needed to select an individual cell or cells in any of the banks are provided to the address selection circuits 500. The other bits of the read or write addresses are provided to the control circuit to generate the read select signal nRSEL and the write select signal nWSEL. The signals nWSEL and nRSEL select or deselect the appropriate banks for simultaneous multiple bank read and write operations. During an erase or a program operation at the bank n, nWSEL is high, and nRSEL is low. For a particular bank n, nWSEL and nRSEL are complements of each other. Therefore, transistor 502 is off and transistor 504 conducts, so that the bit WAh is passed to the latch 540. The bit WAh then appears at the output of the inverter 510 as nAh, the address bit for the local bank n. Similarly, during a read operation at the bank n, nRSEL is high, and nWSEL is low. Thus, transistor 502 conducts and transistor 504 is off, so that the bit RAh is passed to the latch 540. The bit RAh then appears at the output of the inverter 510 as nAh.

Figure 6:
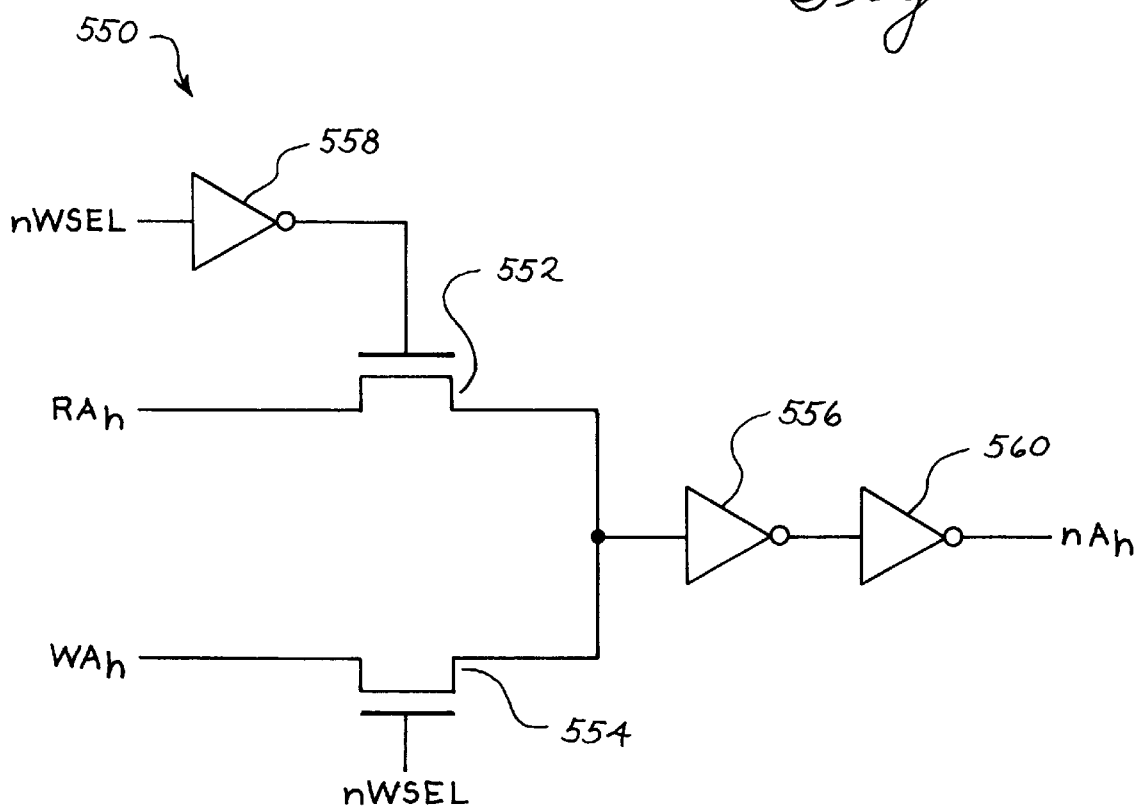
FIG. 6 is a circuit diagram of a second exemplary embodiment of an address selection circuit n that is locally implemented at a bank n of memory cells.

FIG. 6 is a second exemplary address selection circuit 550 according to the multiple bank simultaneous operation flash memory 200. The address selection circuit blocks ASEL0 210, ASEL1 212, ASEL2 214, and ASEL3 216, respectively, may include a series of address selection circuits 550. The second exemplary address circuit 550 includes n-channel transistors 552, 554 and inverters 556, 558, 560.

The circuit 550 exploits the fact that, by design, the signals nWSEL and nRSEL are complements of each other for a particular bank n. The signal nWSEL is applied to the gate of transistor 554 to select the write address bit WAh while the complement of the signal nWSEL is output by the inverter 558 and is applied to the gate of transistor 552 to select the read address bit RAh. A single inverter 556 is located before the inverter 560 rather than a latch as in the latch 540 of FIG. 5. In other respects, the circuit 550 operates identically to the circuit 500 of FIG. 6.

In one embodiment, all of the components of FIGS. 1 and 2 are contained on a single integrated circuit chip. Note that address and control inputs for the exemplary flash memory chips are dependent on memory density and interface implementations. It will be appreciated that the disclosed embodiments can work with different memory densities and alternate interface implementations with their accompanying alternate address and control input configurations.

In a typical embedded application of the above exemplary multiple bank simultaneous operation capable flash memory 200, the available data storage space can be structured to store data and boot code in one bank and control code in another bank. The control code, which can contain command sequences that tell one bank, for example, bank2 204, to program/erase data sectors, can reside as executable code in another bank, for example, bank0 202. While bank2 204 is being programmed/erased, the system can continue to execute code from bank0 202 or another bank to manage other system operations. Similarly, depending on the system implementation, the CPU can also execute code from a first bank while any of the other banks undergoes a program/erase. Preferably, there is no bank switching latency and no need to suspend the program/erase operation to perform the read. This minimizes the CPU's read/write cycle time, maximizes data throughput and reduces overall system cost by eliminating the need for additional hardware.

As used herein, the signal terms and phrases low, not asserted, not active, and inactive are intended broadly to refer to logic low values of a digital signal, generally understood to represent a binary zero (0).

As used herein, the signal terms and phrases high, asserted, and active are intended broadly to refer to logic high values of a digital signal, generally understood to represent a binary one (1).

As used herein, the term write is intended to encompass program and erase operations, as applicable, unless otherwise noted.

As used herein, the phrase "A coupled with B" is defined to mean A directly connected to B, or A indirectly connected with B through one or more intermediate components.

As used herein, the term user is intended to refer to a processor or other component or entity seeking access to memory.

As used herein, the term latch is intended to refer to a temporary data storage element. A temporary storage element may be implemented, for example, as a pair of inverters (as described and illustrated herein), or as a flip-flop such as a D-type flip-flop.

Presented herein is a more flexibly and efficiently designed flash memory, capable of multiple bank simultaneous operation. The embodiments described herein provide addressing, address selection, operation control signals and logic, and access circuitry local to each bank. An individualized architecture that is local to each bank of core cells of memory facilitates and makes practical the extension of the simultaneous operation architecture from dual bank or two banks to N banks.

The embodiments presented herein provide an extendable and flexible multiple bank architecture that is capable of simultaneous operation, that is, that allows simultaneous read and write operations.

From the foregoing, it can be seen that the presently preferred embodiments provide a multiple bank (or N bank) simultaneous operation flash 30 memory, including an address buffering and decoding architecture. For the duration of a read operation at one bank of the N banks, a write operation can only be performed on any one of the other N-1 banks. For the duration of a write operation at one bank of the N banks, a read operation can only be performed on any one of the other N-1 banks. The address buffering and decoding architecture includes a control logic circuit, an address selection circuit located at each of the N banks, and address buffer circuitry. The control logic circuit is used to generate N read select signals to select one bank of the N banks for a read operation and N write select signals to select another bank of the N banks for a write operation. Each address selection circuit is configured to receive from the control logic circuit a respective one of the N read select signals and a respective one of the N write select signals. The address buffer circuitry is used to simultaneously provide a write address and a read address in order to access core memory cells. Respective first portions of the write and read addresses are provided to the control logic circuit to generate the respective N read select signals and N write select signals. Respective second portions of the write and read addresses are provided to the respective address selection circuit.

One advantage of the embodiments is that dual-ported address buffering is employed. Read address bits are output from the buffer simultaneously with write address bits. Another advantage is that read and write operation select signals are provided that respectively correspond the N banks and serve to select or deselect banks for a write or a read operation. Yet another advantage is that circuitry, preferably including sense amplifier interfacing circuits, is provided local to each bank to facilitate extension of a dual bank to a multiple bank or N bank simultaneous operation flash memory.

While a particular embodiment of the present invention has been shown and described, modifications may be made. For example, the senses of the individual transistors, p-channel and n-channel, may be reversed in suitable applications. It is to be noted that suitable transistor sizes specifying channel width to length ratios (measured in micrometers or microns) for the transistors that make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment. Further, the inventive concepts described herein may be applied to circuits other than memory devices.

It is therefore intended that the foregoing detailed description be regarded as illustrative rather than limiting, and that it be understood that it is the following claims, including all equivalents, which are intended to define the spirit and scope of this invention. It is therefore intended in the appended claims to cover all such changes and modifications that fall within the true spirit and scope of the invention.

We claim:

1. An address buffering and decoding architecture to facilitate simultaneous reading from and writing to N banks of core memory cells in a memory, wherein for the duration of a read operation at one bank of the N banks, a write operation can only be performed on any one of the other N-1 banks; and wherein for the duration of a write operation at one bank of the N banks, a read operation can only be performed on any one of the other N-1 banks, the architecture comprising:

a control logic circuit to generate N read select signals to select one bank of the N banks for a read operation and N write select signals to select another bank of the N banks for a write operation;

an address selection circuit located at each of the N banks, wherein each address selection circuit is configured to receive from the control logic circuit a respective one of the N read select signals and a respective one of the N write select signals; and address buffer circuitry to simultaneously provide a write address and a read address in order to access core memory cells, wherein respective first portions of the write and read addresses are provided to the control logic circuit to generate the respective N read select signals and N write select signals, and respective second portions of the write and read addresses are provided to the respective address selection circuit.

2. The address buffering and decoding architecture of claim 1, further comprising:

a write operation control circuit located at each of the N banks, wherein each write operation control circuit is responsive to a respective one of the N write select signals.

3. The address buffering and decoding architecture of claim 2, wherein the write operation control circuit performs a program operation.

4. The address buffering and decoding architecture of claim 2, wherein the write operation control circuit performs an erase operation.

5. The address buffering and decoding architecture of claim 2, wherein the write operation control circuit performs a verify operation.

6. The address buffering and decoding architecture of claim 1, further comprising:
- a read data bus located at each of the N banks, wherein each read data bus is configured for connection to a sense amplifier responsively to a respective one of the N read select signals.

7. The address buffering and decoding architecture of claim 1, further comprising:
- a read data bus located at each of the N banks, wherein any one read data bus is switchably connected to a sense amplifier when a respective one of the N read select signals indicates a read into the bank at which the read data bus is located.

8. The address buffering and decoding architecture of claim 1, further comprising:
- a write data bus located at each of the N banks, wherein each write data bus is configured for connection to a sense amplifier responsively to a respective one of the N write select signals.

9. An N-tuple bank simultaneous operation flash memory, wherein for the duration of a read operation at the Nth bank, a write operation can only be performed on any one of the other N-1 banks, and wherein for the duration of a write operation at the Nth bank is accessed for a write operation, a read operation can only be performed on any one of the other N-1 banks, the memory comprising:
- a control logic circuit to generate N read select signals and N write select signals;
- address buffer circuitry;
- N localized bank circuitries, wherein the circuitries 1 through N-1 comprise N-1 respective banks of core memory cells, and wherein the Nth circuitry comprises:
  an Nth bank of core memory cells;
  address selection circuitry, wherein the address selection circuitry is responsive to the Nth read select signal and the Nth write select signal;
  a write operation control circuit, wherein the write operation control circuit is responsive to the Nth write select signal;
  a write data bus, wherein the write data bus is responsive to the Nth write select signal; and
  a read data bus, wherein the read data bus is responsive to the Nth read select signal.

10. In a memory, a method of performing simultaneous writing and reading of data within a multiple bank flash memory, the method comprising:
- providing a first portion of a write address and a first portion of a read address to N address selection circuits corresponding to N banks of core memory cells;
- providing a second portion of the write address to a control logic circuit, the second portion of the write address defining one bank for a write operation;
- providing a second portion of the read address to a control logic circuit, the second portion of the read address defining one bank for a read operation;
- providing one of N write select signals from the control logic circuit to each bank of the N banks for a write operation;
- providing one of N read select signals from the control logic circuit to select another bank of the N banks for a read operation;
- gating the first portions of the write and read addresses to the N banks with the respective N write select signals and the respective N read select signals; and
- gating the data that are accessed at write and read address sites in the N banks by the first portions of the write and read addresses to data output and verification circuitry with the respective N write select signals and the respective N read select signals.

* * * * *